United States Patent
Furukawa

(10) Patent No.: US 11,923,262 B2
(45) Date of Patent: Mar. 5, 2024

(54) ELECTRICAL APPARATUS

(71) Applicant: DENSO CORPORATION, Kariya (JP)

(72) Inventor: Yasushi Furukawa, Kariya (JP)

(73) Assignee: DENSO CORPORATION, Kariya (JP)

( * ) Notice: Subject to any disclaimer, the term of this patent is extended or adjusted under 35 U.S.C. 154(b) by 52 days.

(21) Appl. No.: 17/514,364

(22) Filed: Oct. 29, 2021

(65) Prior Publication Data

US 2022/0148935 A1    May 12, 2022

(30) Foreign Application Priority Data

Nov. 9, 2020  (JP) ................. 2020-186667

(51) Int. Cl.
| | |
|---|---|
| *H01L 23/31* | (2006.01) |
| *H01L 23/00* | (2006.01) |
| *H01L 23/367* | (2006.01) |
| *H01L 23/495* | (2006.01) |
| *H01L 25/065* | (2023.01) |

(52) U.S. Cl.
CPC ........ *H01L 23/3107* (2013.01); *H01L 23/367* (2013.01); *H01L 23/49568* (2013.01); *H01L 24/32* (2013.01); *H01L 24/33* (2013.01); *H01L 24/48* (2013.01); *H01L 24/73* (2013.01); *H01L 25/0652* (2013.01); *H01L 2224/32245* (2013.01); *H01L 2224/33181* (2013.01); *H01L 2224/48247* (2013.01); *H01L 2224/73265* (2013.01); *H01L 2924/13055* (2013.01); *H01L 2924/1425* (2013.01)

(58) Field of Classification Search
None
See application file for complete search history.

(56) References Cited

U.S. PATENT DOCUMENTS 6,114,750 A * 9/2000 Udagawa ............ H01L 23/3121
257/E23.125
6,320,258 B1 * 11/2001 Mangiagli ......... H01L 23/49562
257/691

(Continued)

FOREIGN PATENT DOCUMENTS

| JP | 2018-137315 A | 8/2018 |
|---|---|---|
| KR | 1020170069365 A | 6/2017 |

*Primary Examiner* — Michelle Mandala
*Assistant Examiner* — Jordan M Klein
(74) *Attorney, Agent, or Firm* — POSZ LAW GROUP, PLC

(57) ABSTRACT

An electrical apparatus includes a semiconductor element, conductors and a covering resin. The conductors are connected to the semiconductor element. At least one of the conductors extends in a first direction. The covering resin covers the semiconductor element and a portion of each of the conductors. The conductors respectively include covering portions and exposing portions. Each of the covering portions is covered by the covering resin. Each of the exposing portions is exposed from the covering resin. The conductors are aligned in a second direction. Two of the exposing portions closest to each other are spaced apart in each of the second direction and a third direction. The third direction is perpendicular to the first direction and the second direction. A shortest separation distance between two closest covering portions is shorter than a shortest separation distance between two closest exposing portions.

3 Claims, 8 Drawing Sheets

(56) References Cited

U.S. PATENT DOCUMENTS

| | | |
|---|---|---|
| 6,362,517 B1 * | 3/2002 | Bell .................... H01L 23/3107 |
| | | 257/730 |
| 9,275,926 B2 | 3/2016 | Hable et al. |
| 9,368,435 B2 | 6/2016 | Otremba et al. |
| 9,370,113 B2 | 6/2016 | Ausserlechner et al. |
| 9,449,895 B2 | 9/2016 | Yoo et al. |
| 9,585,241 B2 | 2/2017 | Hable et al. |
| 9,589,922 B2 | 3/2017 | Neugirg et al. |
| 9,678,173 B2 | 6/2017 | Castro Serrato |
| 9,731,370 B2 | 8/2017 | Uhlemann et al. |
| 9,837,288 B2 | 12/2017 | Basler et al. |
| 9,934,990 B2 | 4/2018 | Yoo et al. |
| 2009/0096072 A1 * | 4/2009 | Balakrishnan .......... H01L 24/97 |
| | | 438/122 |
| 2014/0008776 A1 | 1/2014 | Soller |
| 2014/0291823 A1 | 10/2014 | Soller |
| 2014/0291832 A1 | 10/2014 | Schwarz |
| 2015/0171000 A1 | 6/2015 | Niu et al. |
| 2016/0005675 A1 | 1/2016 | Tong |
| 2016/0211250 A1 | 7/2016 | Langheinrich et al. |
| 2017/0034913 A1 | 2/2017 | Mu et al. |
| 2017/0062317 A1 | 3/2017 | Son et al. |
| 2017/0096066 A1 | 4/2017 | Lee et al. |
| 2018/0040537 A1 | 2/2018 | Grassmann et al. |
| 2018/0082921 A1 | 3/2018 | Grassmann et al. |
| 2018/0082925 A1 | 3/2018 | Grassmann et al. |

* cited by examiner

ELECTRICAL APPARATUS

CROSS REFERENCE TO RELATED APPLICATION

This application is based on Japanese Patent Application No. 2020-186667 filed on Nov. 9, 2020, the disclosure of which is incorporated herein by reference.

TECHNICAL FIELD

The present disclosure relates to an electrical apparatus.

BACKGROUND

An electrical apparatus may include terminal parts and a sealing resin for sealing each of the terminal parts.

SUMMARY

The present disclosure describes an electrical apparatus including a semiconductor element, conductors and a covering resin.

BRIEF DESCRIPTION OF THE DRAWINGS

The objects, features and advantages of the present disclosure will become more apparent from the following detailed description made with reference to the accompanying drawings. In the drawings:

FIG. 11 is a top view illustrating a modification of a signal terminal.

DETAILED DESCRIPTION

Figure 1:
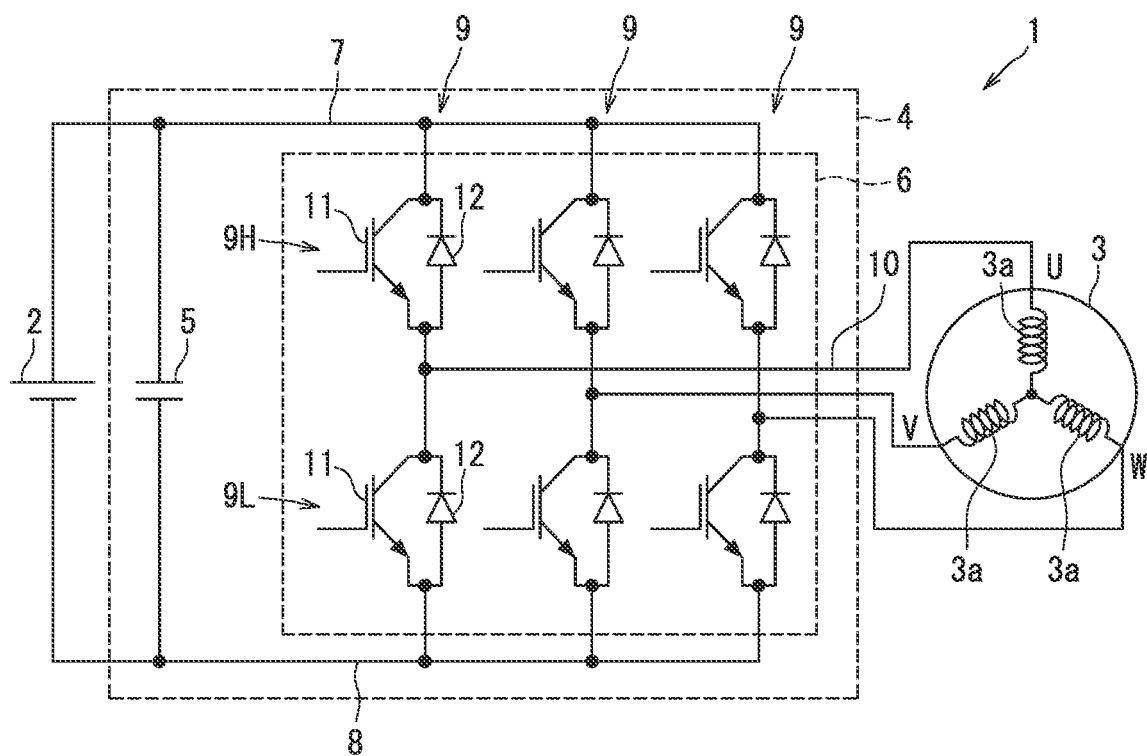
FIG. 1 is a circuit diagram for illustrating a drive system.

An electrical apparatus includes terminal parts and a sealing resin for sealing each of the terminal parts in a comparative example. In the comparative example, a portion of each of the terminal parts is exposed from the sealing resin, and the shortest separation distance between the respective portions of the terminal parts sealed by the sealing resin is identical to the shortest separation distance between the respective portions of the terminal parts exposed from the sealing resin. Therefore, the physical size of the sealing resin tends to be larger, and may lead to an increase in the physical size of the electrical apparatus.

According to an aspect of the present disclosure, an electrical apparatus includes a semiconductor element, conductors and a covering resin. The conductors are respectively connected to the semiconductor element. At least one of the conductors extends in a first direction. The covering resin covers the semiconductor element and a portion of each of the conductors. The conductors respectively include covering portions and exposing portions. Each of the covering portions is covered by the covering resin. Each of the exposing portions is exposed from the covering resin. The conductors are aligned in a second direction being different from the first direction. Two of the exposing portions closest to each other are spaced apart in each of the second direction and a third direction. The third direction is perpendicular to the first direction and the second direction. A shortest separation distance between two of the covering portions closest to each other is shorter than a shortest separation distance between two of the exposing portions closest to each other.

According to the above structure, it is possible to easily suppress the physical size of the covering resin. As a result, it is possible to miniaturize the electrical apparatus.

The following will describe embodiments for carrying out the present disclosure with reference to the drawings. In each embodiment, parts corresponding to the elements described in the preceding embodiments are denoted by the same reference numerals, and redundant explanation may be omitted. When only a part of the configuration is described in each form, the other forms described above can be applied to the other parts of the configuration.

It may be possible not only to combine parts the combination of which is explicitly described in an embodiment, but also to combine parts of respective embodiments the combination of which is not explicitly described if any obstacle does not especially occur in combining the parts of the respective embodiments.

First Embodiment

The following describes a schematic configuration of a vehicle drive system 1 with reference to FIG. 1.

(Vehicle Drive System)

As shown in FIG. 1, a vehicle drive system 1 is provided with a DC power supply 2, a motor generator 3, and a power converter 4.

The DC power supply 2 is a direct-current voltage source including a chargeable/dischargeable secondary battery. The secondary battery is, for example, a lithium ion battery or a nickel hydride battery. The motor generator 3 is a three-phase AC type rotating electric machine. The motor generator 3 functions as a vehicle driving power source, that is, an electric motor. The motor generator 3 functions also as a generator during regeneration. The power converter device 4 performs electric power conversion between the DC power supply 2 and the motor generator 3.

(Power Converter Device)

Next, a circuit configuration of the power converter device 4 will be described with reference to FIG. 1. The power converter device 4 includes a smoothing capacitor 5 and an inverter 6.

The smoothing capacitor 5 mainly smoothens the direct-current voltage (DC voltage) supplied from the DC power supply 2. One of electrodes included in the smoothing capacitor 5 is connected to a positive electrode of the DC power supply 2 and the inverter 6 through a P-bus bar 7. The other one of the electrodes included in the smoothing capacitor 5 is connected to a negative electrode of the DC power supply 2 and the inverter 6 through an N bus bar 8. The DC power supply 2, the smoothing capacitor 5 and the inverter 6 are connected in parallel between the P bus bar 7 and the N bus bar 8.

The inverter 6 corresponds to a DC-AC converter circuit. The inverter 6 converts the direct current to the alternating current by switching control through a control circuit (not shown). The inverter 6 outputs the converted alternating current to the motor generator 3. As a result, the motor generator 3 is driven.

At the time of regenerative braking of the vehicle, the inverter 6 converts the three-phase alternating current generated by the motor generator 3 by receiving the rotational force from wheels into the direct current according to the switching control by the control circuit, and outputs the DC voltage to the P bus bar 7. In this way, the inverter 6 performs bidirectional power conversion between the DC power supply 2 and the motor generator 3.

The inverter 6 includes upper and lower arm circuits 9 for three phases. The upper and lower arm circuits 9 are also referred to as legs. The upper and lower arm circuits 9 includes three-phase upper arms 9H and three-phase lower arms 9L. Each of the three-phase upper arms 9H is connected to the P bus bar 7. Each of the three-phase lower arms 9L is connected to the N bus bar 8. The inverter 6 has six arms.

The upper arm 9H and the lower arm 9L are connected in series between the P bus bar 7 and the N bus bar 8. The connection node between the upper arm 9H and the lower arm 9L is connected to a winding 3a of the corresponding phase of the motor generator 3.

In the present embodiment, an n-channel type insulated gate bipolar transistor 11 is adopted as a switching element included in each arm. In the following, the n-channel type insulated gate bipolar transistor 11 may also be referred to as an IGBT 11. A freewheeling diodes 12 is connected in anti-parallel to each of the IGBTs 11. In the following, the freewheeling diode 12 may also be referred to as an FWD 12.

The collector of the IGBT 11 is connected to the P bus bar 7 in the upper arm 9H as illustrated in FIG. 1. The emitter of the IGBT 11 is connected to the N bus bar 8 in the lower arm 9L. The emitter of the IGBT 11 in the upper arm 9H and the collector of the IGBT 11 in the lower arm 9L are connected. An anode of the FWD 12 is connected to the emitter of the corresponding IGBT 11, and a cathode of the FWD 12 is connected to the collector of the corresponding IGBT 11.

The power converter device 4 may further include a converter as a power converter circuit. The converter is a DC-DC converter circuit for converting the DC voltage to a DC voltage with different value. The converter is disposed between the DC power supply 2 and the smoothing capacitor 5. The converter is configured to include, for example, a reactor and the above-described upper and lower arm circuits 9. The power converter device 4 may further include a filter capacitor for removing power supply noise from the DC power supply 2. The filter capacitor is provided between the DC power supply 2 and the converter.

The power converter device 4 may further be provided with a drive circuit for switching elements of, for example, the inverter 6. The drive circuit supplies a drive voltage to the gate of the IGBT 11 of the corresponding arm based on the drive command of the control circuit. The drive circuit drives the corresponding IGBT 11 by applying a drive voltage to turn on and off the drive of the corresponding IGBT 11. The drive circuit may also be referred to as a driver.

The power converter device 4 may include a control circuit for the switching element. The control circuit generates the drive command based on a torque request input from a higher-level ECU (not shown) or signals detected by various sensors. ECU is an abbreviation for Electronic Control Unit.

Various sensors include, for example, a current sensor, a rotation angle sensor, and a voltage sensor. The current sensor detects the phase current flowing through the winding 3a of each phase. The rotation angle sensor detects the rotation angle of the rotor of the motor generator 3. The voltage sensor detects the voltage across the smoothing capacitor 5. The control circuit outputs, for example, a PWM signal as the drive command. The control circuit includes, for example, a microcomputer. PWM is an abbreviation for Pulse Width Modulation.

(Electrical Apparatus)

The following describes a schematic configuration of the electrical apparatus 15. Three directions orthogonal to one another are referred to as an x-direction, a y-direction, and a z-direction. The x-direction corresponds to a second direction. The y-direction corresponds to a first direction. The z-direction corresponds to a third direction.

Figure 2:
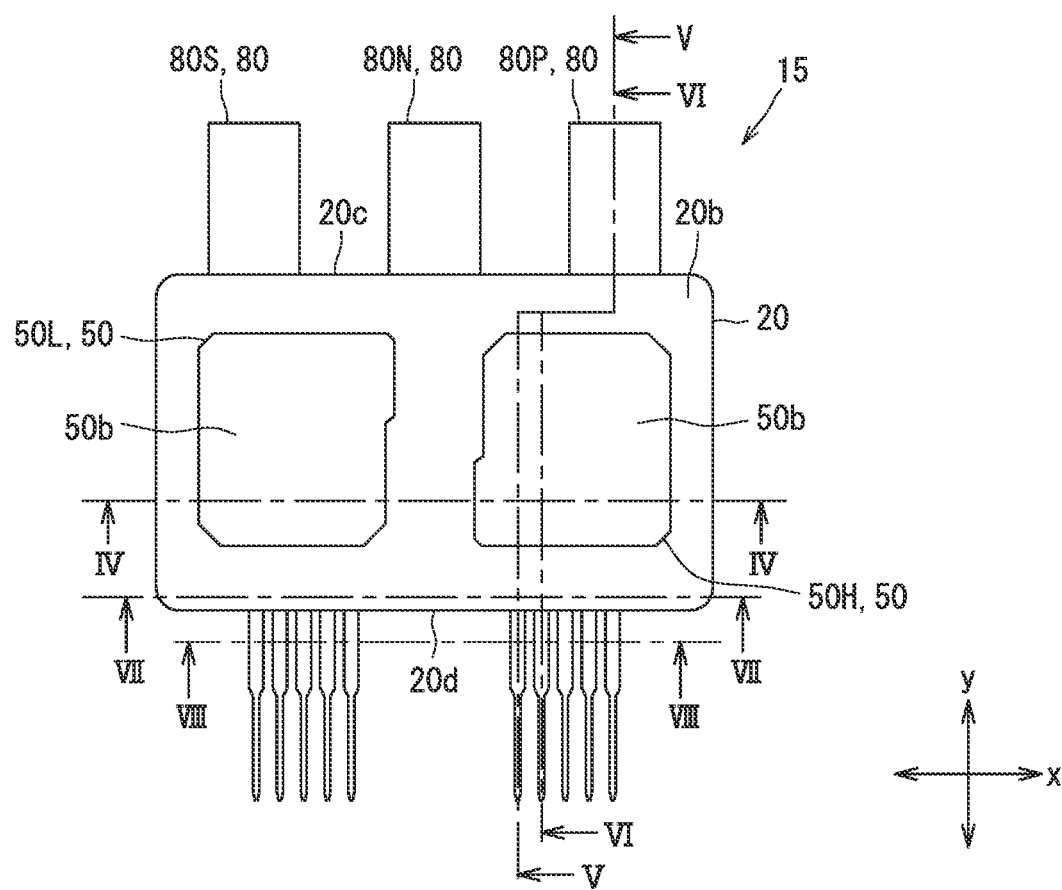
FIG. 2 is a top view illustrating an electrical apparatus.
Figure 3:
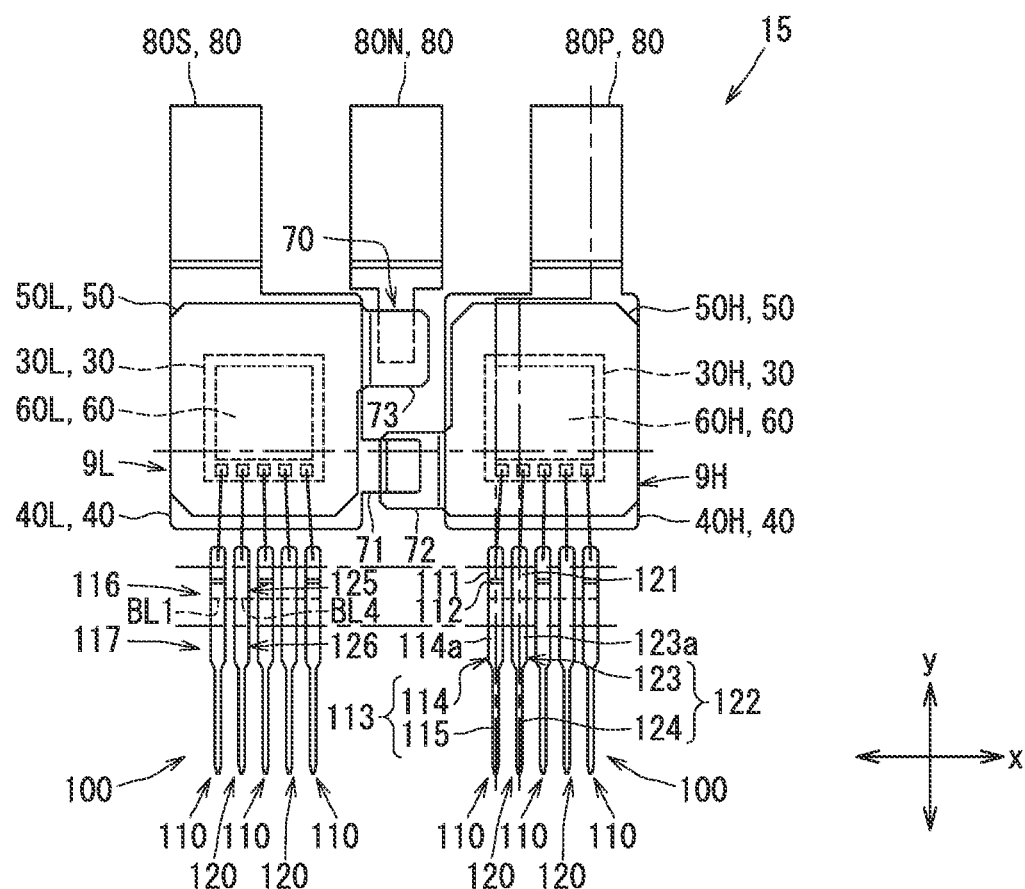
FIG. 3 is a top view of the electrical apparatus in FIG. 2 with the removal of a coating resin.

In the drawings, in order to clarify the position of the cross-sectional line given to FIG. 2, the cross-sectional line corresponding to FIG. 2 is also given to FIG. 3.

In the following, for some of the elements included in the electrical apparatus 15, "H" indicating the upper arm 9H side is added to the end of the reference numeral, and "L" indicating the lower arm 9L is added to the reference numeral. For other elements included in the electrical apparatus 15, common reference numerals are given in the upper arm 9H and the lower arm 9L.

Figure 4:
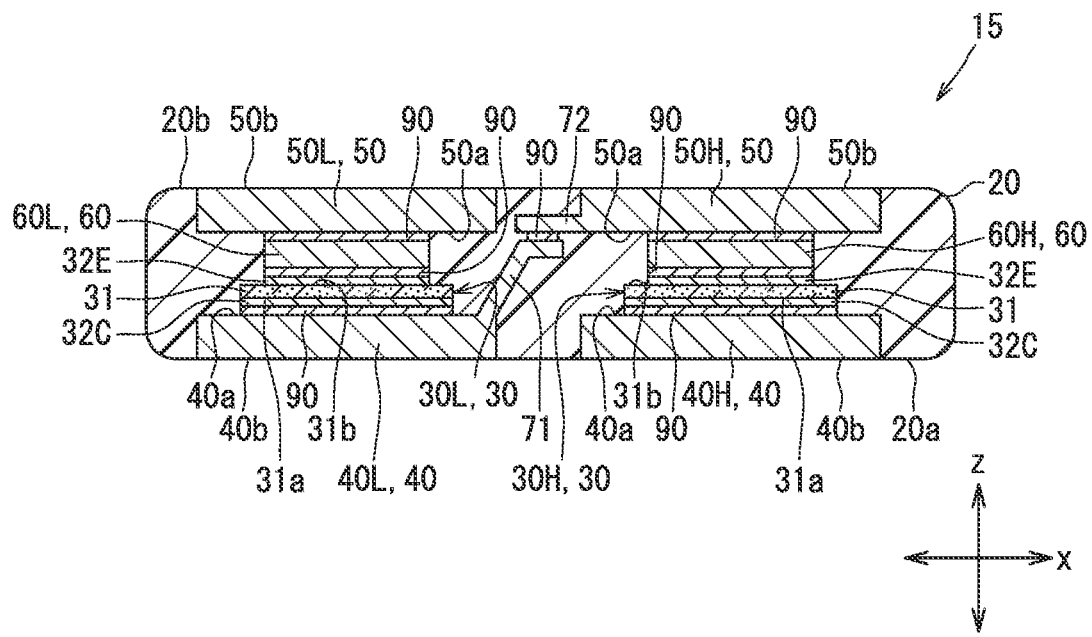
FIG. 4 is a cross-sectional view taken along line IV-IV line of FIG. 2.

As illustrated in FIGS. 2 to 4, the electrical apparatus 15 includes a covering resin 20, two semiconductor chips 30, two first heat sinks 40, two second heat sinks 50, two terminals 60, a joint portion 70, a main terminal 80, and multiple signal terminals 100. The covering resin 20 may also be referred to as a coating resin or a sealing resin.

The electrical apparatus 15 may not include all of the above-mentioned configuration elements. The electrical apparatus 15 may include some of the above-mentioned configuration elements.

The electrical apparatus 15 is included in the upper and lower arm circuits 9 for one phase described above. The semiconductor chip 30, the first heat sinks 40, the second heat sinks 50, the terminal 60 and the signal terminals 100 are provided for each of the upper arm 9H and the lower arm 9L.

The signal terminals 100 includes multiple upper stage terminals 110 and multiple lower stages terminals 120. The upper stage terminals 110 and the lower stage terminals 120 are disposed at the upper arm 9H. The upper stage terminals 110 and the lower stage terminals 120 are disposed at the lower arm 9L. The upper terminals 110 and the lower terminals 120 correspond to conductive parts, conductive portions or conductors.

The joint portion 70 has a first joint portion 71, a second joint portion 72, and a third joint portion 73.

The main terminal 80 has a positive terminal 80P, a negative terminal 80N, and an output terminal 80S. The positive terminal 80P may also be referred to as a positive electrode terminal, and the negative terminal 80N may also be referred to as a negative electrode terminal.

(Sealing Resin)

As illustrated in FIGS. 2 to 4, the covering resin 20 seals some of the configuration elements included in the electrical apparatus 15. In particular, the covering resin 20 seals the two semiconductor chips 30, the two first heat sinks 40, the two second heat sinks 50, the two terminals 60, the joint portion 70, a portion of the main terminal 80, and a portion of each of the signal terminals 100.

Remaining portions of the configuration elements included in the electrical apparatus are exposed from the covering resin 20. In particular, a remaining portion of the main terminal 80 and a remaining portion of each of the signal terminals 100 are exposed from the covering resin 20.

The covering resin 20 is made of material such as an epoxy resin. The covering resin 20 is formed by, for example, a transfer molding method. As shown in FIG. 2, the covering resin 20 has a substantially rectangular shape. The covering resin 20 includes a first main surface 20a aligned in the z-direction, a second main surface 20b at the rear side of the first main surface 20a, and an exposing surface 20c connecting the first main surface 20a and the second main surface 20b. A portion of the main terminal 80 and a portion of each of the signal terminals 100 are exposed from the exposing surface 20c.

(Semiconductor Chip)

The semiconductor chip 30 includes a vertical element formed on a semiconductor substrate 31 made of material such as a wide bandgap semiconductor having a wider bandgap than silicon. Examples of wide bandgap semiconductors include silicon carbide, gallium nitride, gallium oxide and diamond. The semiconductor substrate 31 has a flat shape whose thickness in the z-direction is thin. The vertical element has a vertical structure so that the main current flows in the z-direction. The vertical elements according to the present embodiment are the IGBT 11 and the FWD 12 included in one arm. The semiconductor chip 30 corresponds to a semiconductor element.

As illustrated in FIG. 4, the semiconductor substrate 31 includes a first substrate surface 31a located at the first main surface 20a and a second substrate surface 31b located at the second main surface 20b. A collector electrode 32C is disposed at the first substrate surface 31a. The collector electrode 32C is disposed mostly at the entire surface of the first substrate surface 31a. The collector electrode 32C also functions as a cathode electrode of the diode 12. A gate electrode (not shown) and an emitter electrode 32E are disposed at the second substrate surface 31b. The emitter electrode 32E is disposed at a portion of the second substrate surface 31b. The emitter electrode 32E also functions as an anode electrode of the diode 12.

In addition to the above-mentioned gate electrode and the emitter electrode 32E, multiple pads 32P are disposed at the second substrate surface 31b as illustrated in FIG. 3. The pads 32P are provided at the second substrate surface 31b as to be aligned with the emitter electrode 32E in the y-direction. The pad 32P is an electrode for signals. The pad 32P is electrically isolated from the emitter electrode 32E.

The pads 32P include at least pads 32P for the gate electrode and pads 32P for temperature sensing diodes. In the present embodiment, the semiconductor chip 30 has the five pads 32P. Specifically, the five pads 32P are provided for a gate electrode, a Kelvin emitter for detecting a potential of the emitter electrode 32E, a current sense, an anode potential of a temperature sensor (temperature-sensitive diode) for detecting a temperature of the semiconductor chip 30, and a cathode potential. As illustrated in FIG. 3, five pads 32P are collectively formed at the terminal side of the second substrate surface 31b in the y-direction, and are formed to be spaced apart from each other in the x-direction.

The semiconductor chip 30H at the upper arm side and the semiconductor chip 30L at the lower arm side respectively have identical configurations. In the following, the semiconductor chip 30H at the upper arm side may be referred to as the upper semiconductor chip 30H, and the semiconductor chip 30L at the lower arm side may be referred to as the lower semiconductor chip 30L. As shown in FIG. 4, the upper semiconductor chip 30H and the lower semiconductor chip 30L are aligned and spaced apart in the x-direction as illustrated in FIG. 4. The upper semiconductor chip 30H and the lower semiconductor chip 30L are disposed at a substantially identical position in the z-direction.

(First Heat Sink)

As illustrated in FIG. 4, the first heat sink 40 is disposed to face the collector electrode 32C of the semiconductor chip 30 in the z-direction. The first heat sink 40 is electrically and mechanically connected to the collector electrode 32 through a solder 90. The first heat sink 40 includes a first facing surface 40a as a surface at the semiconductor 30, and a first rear surface 40b at the rear side of the first facing surface 40a.

The first heat sink 40 radiates heat of the semiconductor chip 30 towards outside. The first heat sink 40 may adopt, for example, a metal plate having material such as copper or copper alloy. The first heat sink 40 may include a plating film such as nickel or silver at the surface. The electrical apparatus 15 as described above includes two first heat sinks 40. In particular, two first heat sinks 40 are the first heat sink 40H at the upper arm side and the first heat sink 40L at the lower arm side. In the following, the first heat sink 40H at the upper arm side may be referred to as the upper first heat sink 40H, and the first heat sink 40L at the lower arm side may be referred to as the lower first heat sink 40L.

Figure 5:
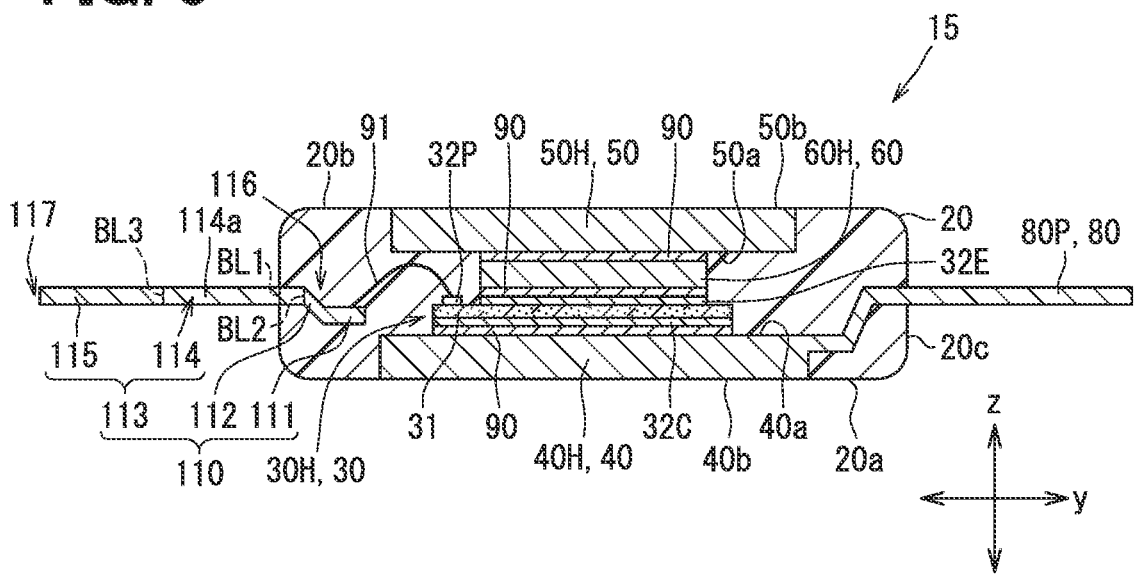
FIG. 5 is a cross-sectional view taken along line V-V of FIG. 2.

As illustrated in FIGS. 4 and 5, the upper first heat sink 40H and the lower first heat sink 40L respectively have substantially rectangular shapes. The upper first heat sink 40H and the lower first heat sink 40L are aligned to be spaced apart from one another in the x-direction. The upper first heat sink 40H and the lower first heat sink 40L have substantially identical thickness, and are disposed at substantially identical positions in the z-direction.

The first facing surface 40a of the upper first heat sink 40H and the collector electrode 32C of the upper semiconductor chip 30H are joined by the solder 90. The first facing surface 40a of the lower first heat sink 40H and the collector electrode 32C of the lower semiconductor chip 30H are joined by the solder 90.

Each of the upper first heat sink 40H and the lower first heat sink 40L completely covers the corresponding semiconductor chip 30 in a plan view in the z-direction. As illustrated in FIG. 4, the respective first rear surfaces 40b of the upper first heat sink 40H and the lower first heat sink 40L are exposed from the covering resin 20. The first rear surface 40b may also be referred to as a heat radiating surface. The first rear surface 40b is substantially made flush with a first main surface 20a of the covering resin 20. The first rear surface 40b of the upper first heat sink 40H and the first rear surface 40b of the lower first heat sink 40L are aligned to be spaced apart from one another in the x-direction.

(Second Heat Sink)

As illustrated in FIG. 4, the second heat sink 50 is disposed to face the terminal 60 in the z-direction. The second heat sink 50 is electrically and mechanically connected to the terminal 60 through the solder 90. The second heat sink 50 includes a second facing surface 50a as a surface at the semiconductor 30, and a second rear surface 50b at the rear side of the second facing surface 50a.

The second heat sink 50 radiates heat of the semiconductor chip 30 towards outside. The second heat sink 50 may adopt, for example, a metal plate having material such as copper or copper alloy. The second heat sink 50 may include a plating film such as nickel or silver at the surface. The electrical apparatus 15 as described above includes two second heat sinks 50 and two terminals 60. In particular, the two second heat sinks 50 are the second heat sink 50H at the upper arm side and the second heat sink 50L at the lower arm side. In the following, the second heat sink 50H at the upper arm side may be referred to as the upper second heat sink 50H, and the second heat sink 50L at the lower arm side may be referred to as the lower second heat sink 50L. In particular, the two terminals 60 are a terminal 60H at the upper arm side and a terminal 60L at the lower arm side. The terminal 60H at the upper arm side may also be referred to as the upper terminal 60H, and the terminal at the lower arm side may also be referred to as the lower terminal 60L. The following describes the terminals 60 in detail.

As illustrated in FIGS. 4 and 5, the upper second heat sink 50H and the lower second heat sink 50L respectively have substantially rectangular shapes. The upper second heat sink 50H and the lower second heat sink 50L are aligned to be spaced apart from one another in the x-direction. The upper second heat sink 50H and the lower second heat sink 50L have substantially identical thickness, and are disposed at substantially identical positions in the z-direction. A second facing surface 50a of the upper second heat sink 50H and the surface of the upper terminal 60H at the second facing surface 50a are joined by the solder 90. The second facing surface 50a of the lower second heat sink 50L and the surface of the lower terminal 60L at the second facing surface 50a are joined by the solder 90.

Each of the upper second heat sink 50H and the lower second heat sink 50L completely covers the corresponding semiconductor chip 30 in a plan view in the z-direction. As illustrated in FIG. 4, the respective second rear surfaces 50b of the upper second heat sink 50H and the lower second heat sink 50L are exposed from the covering resin 20. The second rear surface 50b may also be referred to as a heat radiating surface. The second rear surface 50b is substantially made flush with a second main surface 20a of the covering resin 20. The second rear surface 40b of the upper second heat sink 50H and the second rear surface 50b of the lower second heat sink 50L are aligned to be spaced apart from one another in the x-direction.

(Terminal)

The terminal 60 is interposed between the semiconductor chip 30 and the second heat sink 50 in the z-direction, and electrically relays the emitter electrode 32E and the second heat sink 50. The terminal 60 is located in the midway of electrical and thermal conduction paths between the emitter electrode 32E and the second heat sink 50. The terminal 60 is a columnar body formed by adopting a metal material such as copper or copper alloy. The terminal 60 may include a plating film at the surface. The terminal 60 may be referred to as a metal block body or a relay member.

As described above, the surface of the upper terminal 60H at the second facing surface 50a and the second facing surface 50a of the upper second heat sunk 50H are joined by the solder 90. The surface of the upper terminal 60H at the upper semiconductor chip 30H and the second substrate surface 31b of the upper semiconductor chip 30H are joined by the solder 90.

As described above, the surface of the lower terminal 60L at the second facing surface 50a and the second facing surface 50a of the lower second heat sunk 50L are joined by the solder 90. The surface of the lower terminal 60L at the lower semiconductor chip 30L and the second substrate surface 31b of the lower semiconductor chip 30L are joined by the solder 90.

(Joint Portion)

The first joint portion 71 and the second joint portion 72 electrically connect the upper arm 9H and the lower arm 9L. As illustrated in FIG. 4, the first joint 71 and the second joint 72 are joined by the solder 90. The third joint portion 73 electrically connects the lower arm 9L and the negative terminal 80N.

(Main Terminal)

The main terminal 80 is a terminal electrically connecting the electrode of the semiconductor chip 30. The main terminal 80 has a positive terminal 80P, a negative terminal 80N, and an output terminal 80S. The positive terminal 80P may also be referred to as a positive electrode terminal, and the negative terminal 80N may also be referred to as a negative electrode terminal. The positive terminal 80P and the negative terminal 80N are power supply terminals. The positive terminal 80P may also be referred to as a P terminal or a high-potential power supply terminal. The negative terminal 80N may also be referred to as an N terminal or a low-potential power supply terminal.

The output terminal 80S is connected to the connection node between the upper arm 9H and the lower arm 9L. The output terminal 80S of the electrical apparatus 15 is electrically connected to the winding 3a of the corresponding phase of the motor generator 3. The output terminal 80S may also be referred to as an O terminal or an AC terminal.

The positive terminal 80P is extended from the end of the upper first heat sink 40H in the y-direction. The output terminal 80S is extended from the lower first heat sink 40L in the y-direction. The negative terminal 80N extends so as to be apart from the upper arm 9H and the lower arm 9L in the y-direction. The negative terminal 80N is joined to the third portion 73 through, for example, the solder 90 (not shown).

The positive terminal 80P, the negative terminal 80N and the output terminal 80S are spaced apart and displaced in order in the x-direction. A portion of the positive terminal 80P, the negative terminal 80N and the output terminal 80S is sealed by the covering resin 20. The remaining portion of the positive terminal 80P, the negative terminal 80N and the output terminal 80S is exposed from the covering resin 20.

(Upper Terminal)

As illustrated in FIG. 3, the upper terminals 110 are aligned to be spaced apart from one another in the x-direction. The respective shapes of the upper terminals 110 are similar.

As illustrated in FIG. 5, the upper terminal 110 is electrically connected to the pad 32P of the corresponding chip 30. In particular, the upper terminal 110 is electrically connected to the pad 32P of the corresponding chip 30 through a bonding wire 91.

As illustrated in FIGS. 3 and 5, each of the multiple terminals 110 includes a first upper connection portion 111 and a third upper connection portion 113 extending in the y-direction, and a second upper connection portion 112 extending in the y-direction and the z-direction. The second upper connection portion 112 corresponds to a bent portion.

As illustrated in FIG. 5, the end of the first upper connection portion 111 is connected to the pad 32P. The first upper connection portion 111 extends in the y direction so as to be spaced apart from the pad 32P. The second upper connection portion 112 is connected to the end of the first upper connection portion 111 at a side spaced apart from the pad 32P of the first upper connection portion 111. The second upper connection portion 112 extends in the y-direction and the z-direction to be spaced apart from the first upper connection portion 111. The third upper connection portion 113 is connected to the end of the second upper connection portion at a side to be spaced apart from the first upper connection portion 111. The third upper connection portion 113 extends in the y-direction to be spaced apart from the second upper connection portion 112.

The third upper connection portion 113 includes an upper base portion 114 and an upper tip portion 115. Each of the third connection portion 113 and the upper tip portion 115 extends in the y-direction. The upper base portion 114 is connected to the end of the second upper connection portion 112 at a side spaced apart from the first upper connection portion 111. The upper tip portion 115 is connected to the end of the upper base portion 114 at a side spaced apart from the second upper connection portion 112.

As illustrated in FIG. 3, the respective widths of the first upper connection portion 111, the second upper connection portion 112 and the upper base portion 114 are similar in the x-direction. The width of the upper tip portion 115 in the x-direction is narrower than the respective widths of the first upper connection portion 111, the second upper connection portion 112 and the upper base portion 114.

A portion of the upper terminal 110 is coated or covered by the covering resin 20 as illustrated in FIG. 5. The remaining portion of the upper terminal 110 is exposed from the covering resin 20. In particular, a portion of the first upper connection portion 111, the second upper connection portion 112 and the upper base portion 114 is covered or coated by the covering resin 20. The upper tip portion 115 and the remaining portion of the upper base portion 114 are exposed from the covering resin 20.

In the following, the upper terminal 110 coated or covered by the covering resin 20 is referred to as an upper covering portion 116. The upper terminal 110 exposed from the covering resin 20 is referred to as an upper exposing portion 117. Furthermore, the remaining portion of the upper base portion 114 exposed from the covering resin 20 included in the upper exposing portion 117 is referred to as an upper exposing base portion 114a. The upper covering portion 116 corresponds to a covering portion. The upper exposing portion 117 corresponds to an exposing portion.

In FIG. 3, a boundary line BL 1 between the upper covering portion 116 and the upper exposing portion 117 is indicated by a broken line. In FIG. 5, a boundary line BL2 between the second upper connection portion 112 and the third upper connection portion 113 and a boundary line BL3 between the upper exposing base portion 114a and the upper tip portion 115 are respectively indicated by broken lines.

(Lower Terminal)

As illustrated in FIG. 3, multiple lower terminals 120 are aligned to be spaced apart from one another in the x-direction. The respective shapes of the lower terminals 120 are similar.

Figure 6:
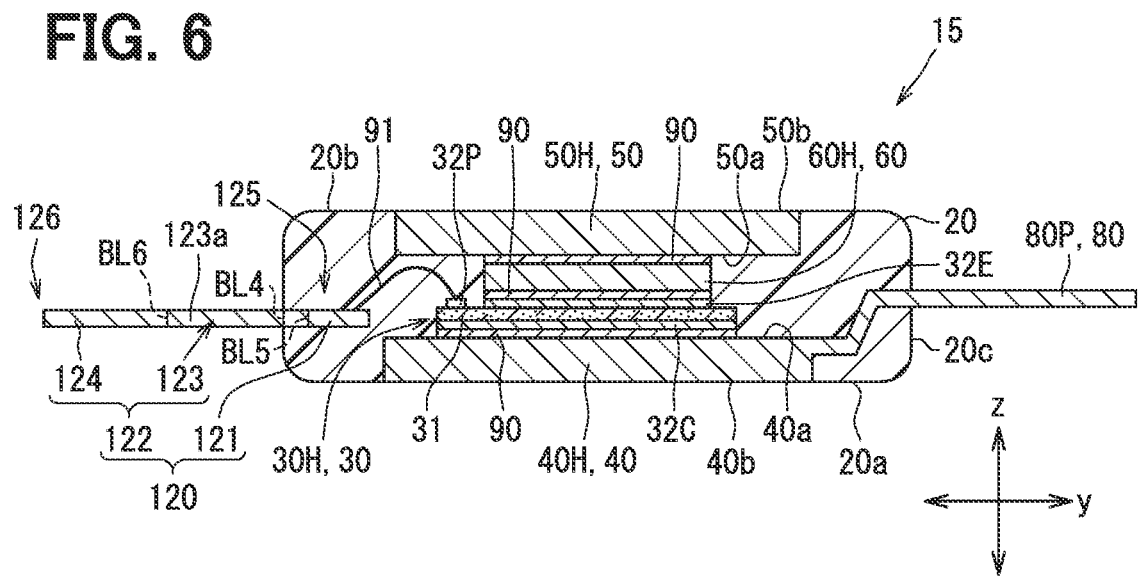
FIG. 6 is a cross-sectional view taken along line VI-VI of FIG. 2.

As illustrated in FIG. 6, the lower terminal 120 is electrically connected to the pad 32P of the corresponding chip 30. In particular, the lower terminal 120 is electrically connected to the pad 32P of the corresponding chip 30 through a bonding wire 91.

As illustrated in FIGS. 3 and 6, each of the lower terminals 120 includes a first lower connection portion 121 and a second lower connection portion 122 extending in the y-direction.

The end of the first lower connection portion 121 is connected to the pad 32P. The first lower connection portion 121 extends in the y direction so as to be spaced apart from the pad 32P. The second lower connection portion 122 is connected to the end of the first lower connection portion 121 at a side spaced apart from the pad 32P of the first lower connection portion 121. The second lower connection portion 122 extends in the y-direction so as to be spaced apart from the first lower connection portion 121.

The second lower connection portion 122 includes a lower base portion 123 and a lower tip portion 124. Each of the lower base portion 123 and the lower tip portion 124 extends in the y-direction. The lower base portion 123 is connected to the end of the first lower connection portion 121 at a side spaced apart from the connection node with the bonding wire 91. The lower tip portion 124 is connected to the end of the lower base portion 123 at a side spaced apart from the first lower connection portion 121.

As illustrated in FIG. 3, the respective widths of the first lower connection portion 121 and the lower base portion 123 are similar in the x-direction. The width of the lower tip portion 124 in the x-direction is narrower than the respective widths of the first lower connection portion 121 and the lower base portion 123 in the x-direction.

A portion of the lower terminal 120 is coated or covered by the covering resin 20 as illustrated in FIG. 6. The remaining portion of the lower terminal 120 is exposed from the covering resin 20. In particular, a portion of the first lower connection portion 121 and the lower base portion 123 are coated or covered by the covering resin 20. The lower tip portion 124 and a remaining portion of the lower base portion 123 are exposed from the covering resin 20.

In the following, the lower terminal 120 coated or covered by the covering resin 20 is referred to as a lower covering portion 125. The lower terminal 120 exposed from the covering resin 20 is referred to as a lower exposing portion 126. Furthermore, the remaining portion of the lower base portion 123 exposed from the covering resin 20 included in the lower exposing portion 126 is referred to as a lower exposing base portion 123a. The lower covering portion 125 corresponds to a covering portion. The lower exposing portion 126 corresponds to an exposing portion.

In FIG. 3, a boundary line BL4 between the lower covering portion 125 and the lower exposing portion 126 is indicated by a broken line. In FIG. 6, a boundary line BL5 between the first lower connection portion 121 and the second lower connection portion 122 and a boundary line BL6 between the lower exposing base portion 123a and the lower tip portion 124 are respectively indicated by broken lines.

(First Upper Connection Portion and First Lower Connection Portion)

Figure 7:
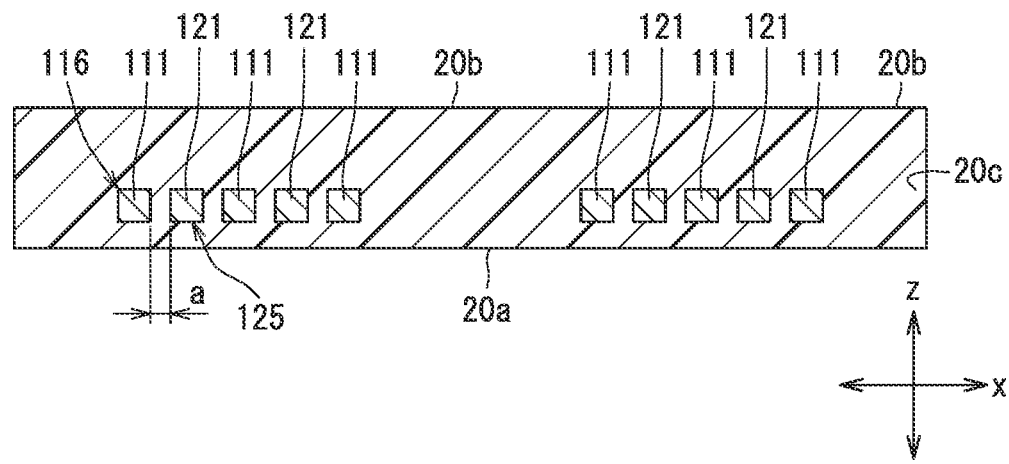
FIG. 7 is a cross-sectional view taken along line VII-VII of FIG. 2.

As illustrated in FIG. 7, first upper connection portions 111 are aligned to be spaced apart from one another in the x-direction. First lower connection portions 121 are aligned to be spaced apart from one another in the x-direction. Regarding the arrangement of the first upper connection portion 111 and the first lower connection portion 121, the first upper connection portions 111 and the first lower connection portions 121 are alternately aligned so as to be spaced part in the x-direction. In FIG. 7, the cross section along the VII-VII line illustrated in FIG. 2 is illustrated in a simplified manner.

(Upper Exposing Base Portion and Lower Exposing Base Portion)

Figure 8:
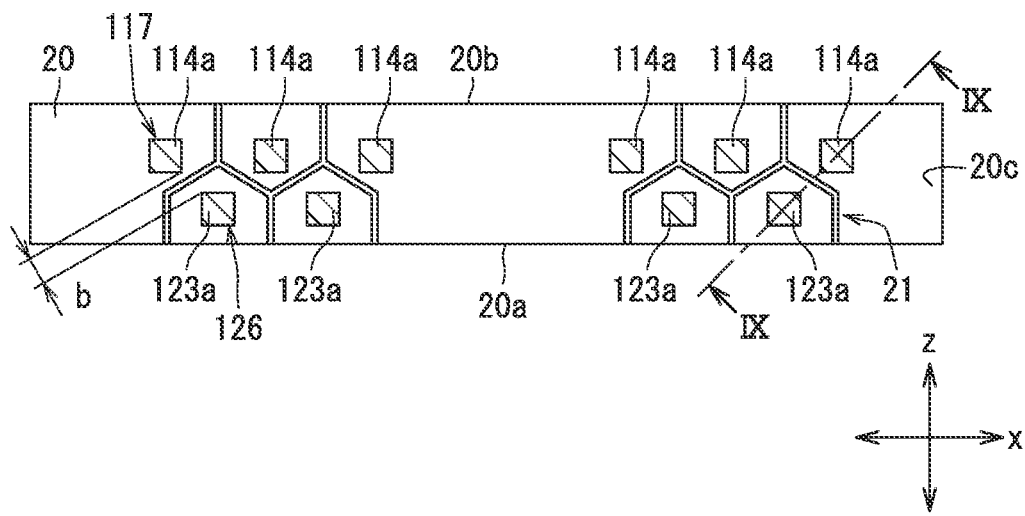
FIG. 8 is a cross-sectional view taken along line VIII-VIII of FIG. 2.

As illustrated in FIG. 8, each of the upper exposing base portions 114a is provided closer to the second main surface 20b than each of the lower exposing base portions 123a. In other words, each of the lower exposing portions 123a is provided closer to the first main surface 20a than each of the upper exposing base portions 114a. Each of the lower exposing base portions 123a is disposed between the adjacent upper exposing base portions 114a in the x-direction.

Regarding the arrangement of the upper exposing base portions 114a and the lower exposing base portions 123a, the upper exposing base portions 114a and the lower exposing base portions 123a are aligned to be spaced apart from one another alternately in the x-direction and the z-direction. The upper exposing base portions 114a and the lower exposing base portions 123a are arranged in zigzag alternately as viewed from the first main surface 20a and the second main surface 20b. In FIG. 8, the cross section along the VIII-VIII line illustrated in FIG. 2 is illustrated in a simplified manner.

(Separation Distance Between Upper Terminal and Lower Terminal)

As described above, the first upper connection portions 111 and the first lower connection portions 121 are alternately aligned to be spaced apart from one another in the x-direction. The upper exposing base portions 114a and the lower exposing base portions 123a are alternately aligned to be spaced part from one another in the x-direction and the z-direction.

The first separation distance "a" between the first upper connection portion 111 and the first lower connection portion 121 which are the closest to each other illustrated in FIG. 7 is shorter than the second separation distance "b" between the upper exposing base portion 114a and the lower exposing base portion 123a which are the closest to each other illustrated in FIG. 8.

The first separation distance "a" between the first upper connection portion 111 and the first lower connection portion 121 which are the closest to each other corresponds to a shortest separation distance between the upper covering portion 116 and the lower covering portion 125 which are the closest to each other. The second separation distance "b" between the upper exposing base portion 114a and the lower exposing base portion 123a which are the closest to each other corresponds a shortest separation distance between the upper exposing portion 117 and the lower exposing portion 126 which are the closest to each other.

Although not shown, the first separation distance "a" is shorter than the separation distance between the upper tip portion 115 and the lower tip portion 124 which are the closest to each other.

The covering resin 20 has a higher insulating property than air. Even though the first separation distance "a" is shorter than the second separation distance "b", the insulation between the first upper connection portion 111 and the first lower connection portion 121 which are the closest to each other can be easily maintained. The upper terminal 110 and the lower terminal 120 can be aligned so that the first separation distance "a" is shorter than the second separation distance b. It is no longer necessary to make the first separation distance "a" and the second separation distance "b" to be equal so that the first separation distance a matches the second separation distance "b".

(Groove)

Figure 9:
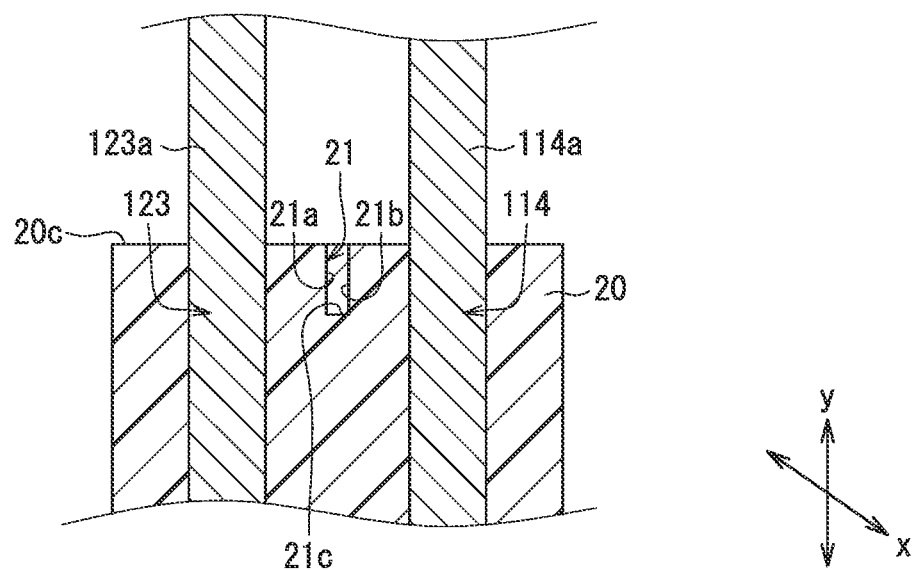
FIG. 9 is a cross-sectional view taken along line IX-IX of FIG. 8.

As illustrated in FIGS. 8 and 9, a groove portion 21 recessed in the z-direction is formed at an exposing surface 20c of the covering resin 20 where each of the upper exposing base portions 114a and the lower exposing base portion 123a is exposed. As illustrated in FIG. 8, the groove portion 21 is formed at the exposing surface 20c so as to be located between the adjacent terminals. In FIG. 9, the cross section along the IX-IX line illustrated in FIG. 8 is illustrated in a simplified manner. The groove portion 21 corresponds to a roughened portion, an uneven portion or a groove.

As illustrated in FIG. 8, the groove portion 21 is formed between the upper exposing base portion 114a and the lower exposing base portion 123a which are the closest to each other. In addition, the groove portion 21 is formed between the two upper exposing base portions 114a which are the closest to each other. Moreover, the groove portion 21 is formed between the two lower exposing base portions 123a which are the closest to each other.

As illustrated in FIG. 9, the groove portion 21 includes a first wall surface 21a, a second wall surface 21b and a third wall surface 21c. The first wall surface 21a and the second wall surface 21b are aligned to be spaced apart from one another in a direction where two adjacent terminals are aligned. The third wall surface 21c is located at a side spaced apart from the exposing surface 20c. The third wall surface 21c connects the first wall surface 21a and the second wall surface 21b.

Therefore, a creepage distance along the exposing surface 20c between the two adjacent terminals becomes longer. In particular, the creepage distance along the exposing surface 20c between the upper exposing base portion 114a and the lower exposing base portion 123a which are the closest to each other becomes longer. The creepage distance along the exposing surface 20c between the two upper exposing base portions 114a closest to each other. The creepage distance along the exposing surface 20c between the two lower exposing base portions 123a which are the closest to each other.

(Operation and Advantageous Effects)

As described above, the first upper connection portions 111 and the first lower connection portions 121 coated or covered by the covering resin 20 are alternately aligned to be spaced apart from one another in the x-direction. The upper exposing base portions 114a and the lower exposing base portions 123a exposed from the covering resin 20 are alternately aligned to be spaced apart from one another in the x-direction.

As described above, the first separation distance "a" between the first upper connection portion 111 and the first lower connection portion 121 which are the closest to each other is shorter than the second separation distance "b" between the upper exposing base portion 114a and the lower exposing base portion 123a which are the closest to each other. Therefore, an increase in the physical size of the covering resin 20 in the x-direction is easily suppressed. As a result, it is possible to miniaturize the electrical apparatus 15.

As described above, the second upper connection portion 112 extending in each of the y-direction and the z-direction is covered or coated by the covering resin 20. The covering resin 20 has a higher insulating property than air. Therefore, the discharge at the second upper connection portion 112 is easily suppressed. Furthermore, damage on the second upper connection portion 112 due to, for example, an external force is easily suppressed.

As described above, the groove portion 21 is formed at the exposing surface 20c between the adjacent terminals. Therefore, a creepage distance along the exposing surface 20c between the two adjacent terminals becomes longer. As a result, the insulation property between two adjacent terminals tends to enhance.

(First Modification)

Figure 10:
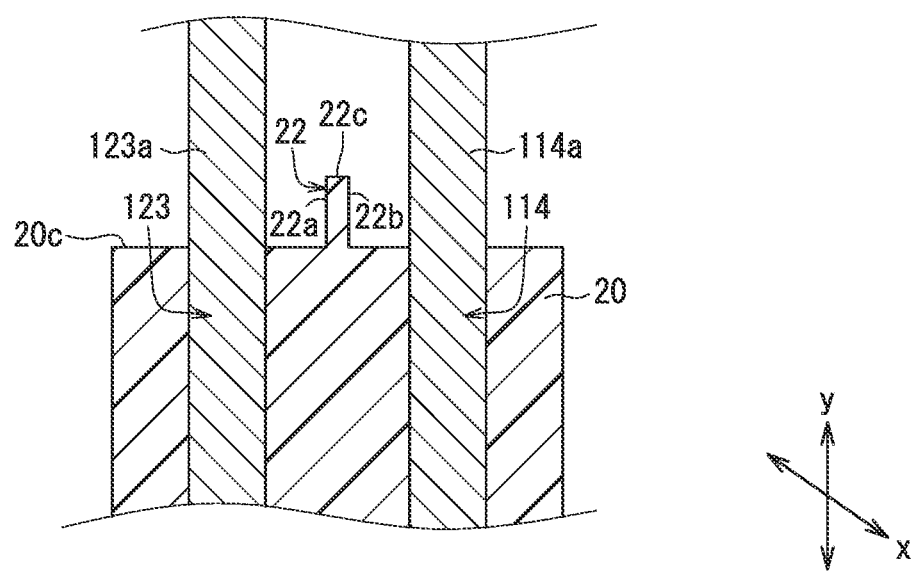

In the embodiment as described above, the groove portion 21 is formed at the exposing surface 20c between the adjacent terminals. However, the groove 21 may not be formed at the exposing surface 20c. As illustrated in FIG. 10, a protruding portion 22 protruding from the exposing surface 20c may be formed. In this case, the protruding portion 22 includes a first protruding surface 22a, a second protruding surface 22b and a third protruding surface 22c. The first protruding surface 22a and the second protruding surface 22b are aligned to be spaced apart from one another in a direction where two adjacent terminals are aligned. The third protruding surface 22c is located at a side spaced apart from the exposing surface 20c. The third protruding surface 22c connects the first protruding surface 22a and the second protruding surface 22b. Therefore, the creepage distance along the exposing surface 20c between two adjacent terminals becomes longer. The insulation property between two adjacent terminals tends to enhance. The protruding portion 22 corresponds to a roughened portion, an uneven portion or a protrusion.

(Second Modification)

Figure 11:
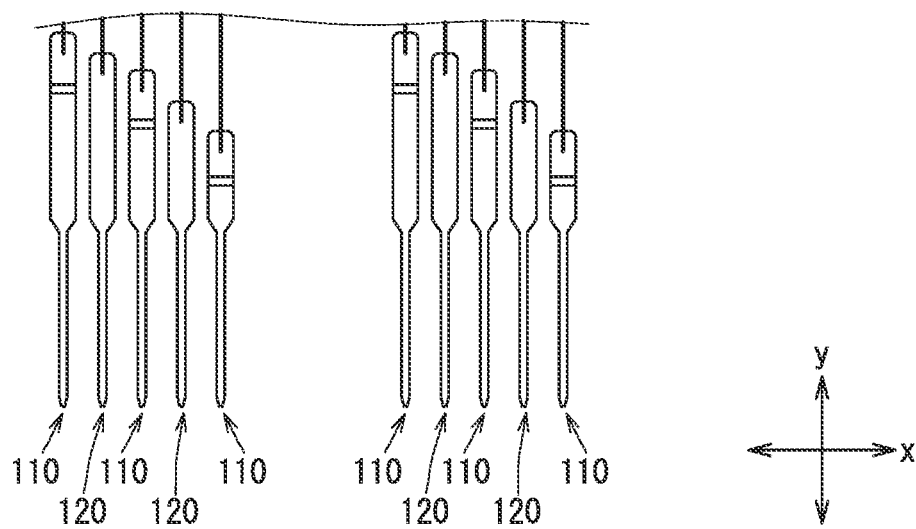
FIG. 11 is a cross-sectional view illustrating a modification of a roughened portion.

The embodiment described above describes that the respective shapes of the upper terminals 110 and the lower terminals 120 are similar. However, as illustrated in FIG. 11, the respective lengths of the upper terminals 110 may be different. The respective lengths of the lower terminals 120 may be different. The respective lengths of all terminals including the upper terminals 110 and the lower terminals 120 may also be different.

Figure 12:
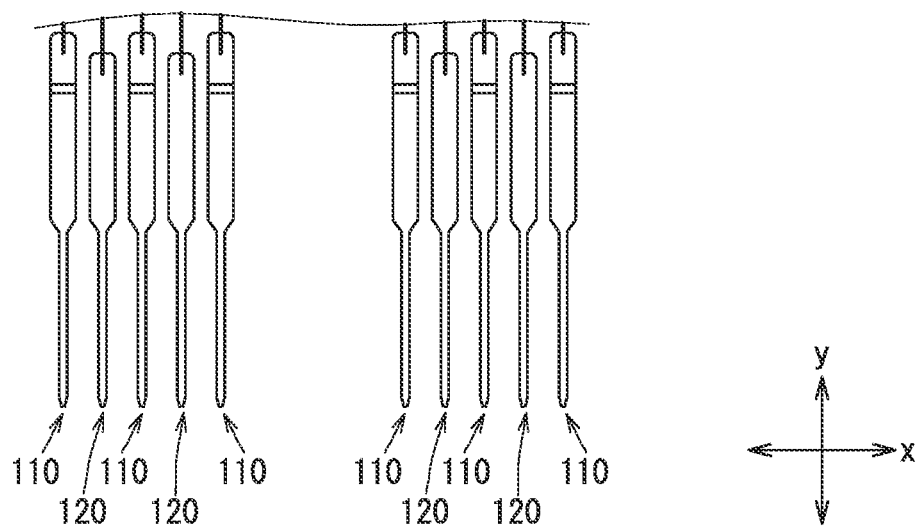
FIG. 12 is a top view illustrating a modification of a signal terminal.

As illustrated in FIG. 12, the length of the lower terminal 120 in the y-direction may be shorter than the length of the upper terminal 110 in the y-direction. Although not shown, the length of the upper terminal 110 in the y-direction may be shorter than the length of the lower terminal 120 in the y-direction.

(Third Modification)

Figure 13:
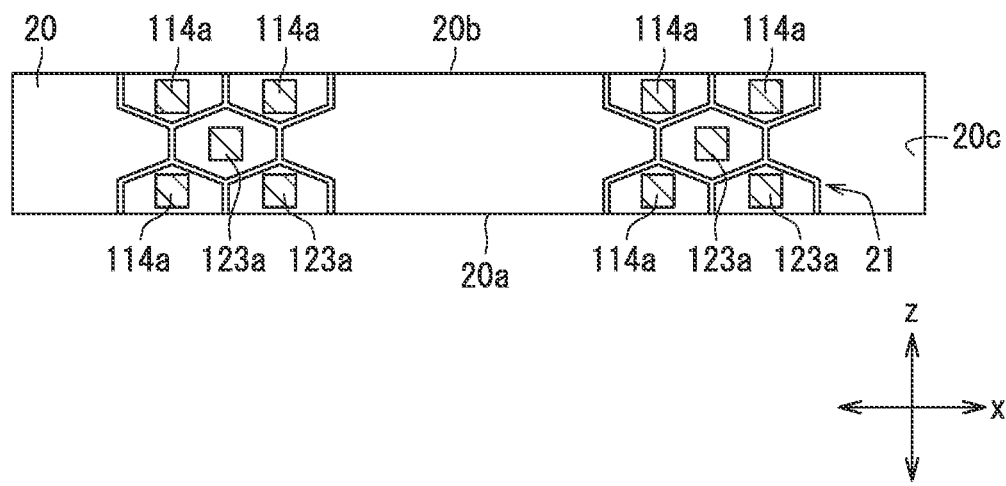
FIG. 13 is a cross-sectional view for illustrating a modification of an upper exposing portion and a lower exposing portion.

The above embodiment describes that the upper exposing base portion 114a and the lower exposing base portion 123a are arranged in zigzag at the first main surface 20a and the second main surface 20b. However, if the first separation distance "a" is shorter than the second separation distance "b", the upper exposing base portion 114a and the lower exposing base portion 123a may not be aligned in zigzag. For example, as illustrated in FIG. 13, the upper exposing base portion 114a and the lower exposing base portion 123a may be aligned in three stages in the z-direction.

(Fourth Modification)

Figure 14:
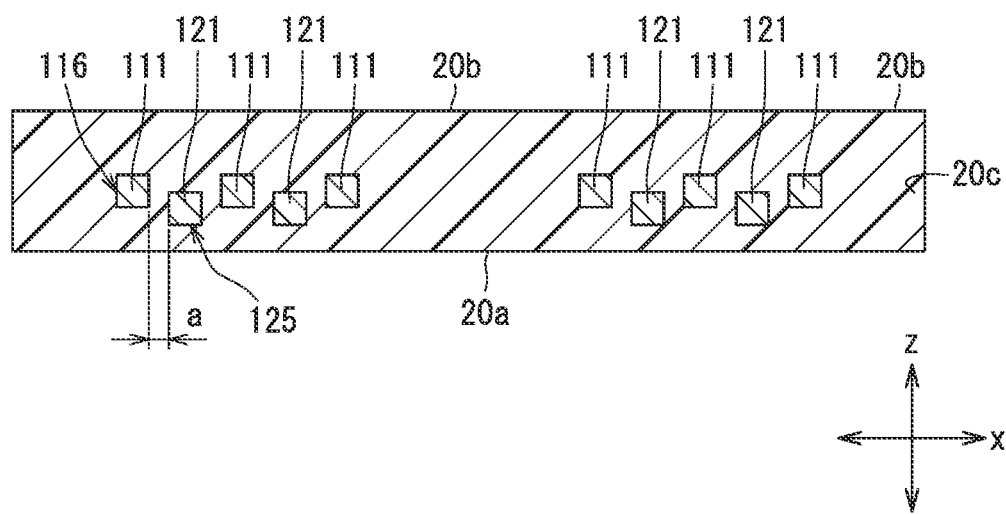
FIG. 14 is a cross-sectional view for illustrating a modification of a first upper connection portion and a first lower connection portion.

As described above, the first upper connection portions 111 and the first lower connection portions 121 are aligned to be spaced apart from one another in the x-direction alternately. However, in a situation where the first separation distance "a" is shorter than the second separation distance "b", as illustrated in FIG. 14, the first upper connection portions 111 and the first lower connection portions 121 may be aligned in the x-direction and the z-direction. Even in this case, an increase in the physical size of the covering resin 20 is easily suppressed. It is possible to miniaturize the electrical apparatus 15.

What is claimed is:

1. An electrical apparatus comprising:
a semiconductor element;
a plurality of conductors respectively configured to be connected to the semiconductor element, at least one of the conductors extending in a first direction; and
a covering resin configured to cover the semiconductor element and a portion of each of the conductors,
wherein the conductors respectively include covering portions and exposing portions,
wherein each of the covering portions is covered by the covering resin,
wherein each of the exposing portions is exposed from the covering resin,
wherein the conductors are aligned in a second direction being different from the first direction,
wherein two of the exposing portions closest to each other are spaced apart in each of the second direction and a third direction,
wherein the third direction is perpendicular to the first direction and the second direction,
wherein a shortest separation distance between two of the covering portions closest to each other is shorter than a shortest separation distance between two of the exposing portions closest to each other, and
wherein an entire length of each of the conductors exposed from the covering resin extends in the first direction.

2. The electrical apparatus according to claim 1, wherein at least one of the covering portions includes a bent portion that is bent in the third direction.

3. The electrical apparatus according to claim 1, wherein the covering resin has an exposing surface at which the exposing portions are exposed from the covering resin, and
wherein the exposing surface of the covering resin has an uneven portion disposed between adjacent two of the exposing portions.

* * * * *